US006337587B2

(12) United States Patent
Kruecke

(10) Patent No.: US 6,337,587 B2
(45) Date of Patent: Jan. 8, 2002

(54) CIRCUIT ARRANGEMENT FOR DRIVING A LOAD BY TWO TRANSISTORS

(75) Inventor: Ludger Kruecke, Witten (DE)

(73) Assignee: Elmos Semiconductor AG, Dortmund (DE)

( * ) Notice: Subject to any disclaimer, the term of this patent is extended or adjusted under 35 U.S.C. 154(b) by 0 days.

(21) Appl. No.: 09/764,206

(22) Filed: Jan. 19, 2001

(30) Foreign Application Priority Data

Jan. 19, 2000 (DE) ........................................ 100 02 037

(51) Int. Cl.[7] .................................................. H03K 3/00

(52) U.S. Cl. ........................ 327/112; 327/110; 327/423

(58) Field of Search ......................... 327/108–112, 423, 327/424, 588, 427, 434–436

(56) References Cited

U.S. PATENT DOCUMENTS 5,333,081 A * 7/1994 Mitsui ........................ 327/110
6,040,734 A * 3/2000 Villa et al. .................. 327/423
6,201,421 B1 * 3/2001 Takeuchi et al. ............ 327/110
6,262,620 B1 * 7/2001 Jenski et al. ................ 327/424

FOREIGN PATENT DOCUMENTS

DE 1513168 10/1969

* cited by examiner

*Primary Examiner*—Toan Tran
(74) *Attorney, Agent, or Firm*—Birch, Stewart, Kolasch & Birch, LLP

(57) ABSTRACT

A circuit arrangement, provided for driving a load by two transistors connected in series with the load, comprises a first transistor (M1) provided with a control input adapted to receive a first control signal, and with a conductive path to be controlled in dependence on the first control signal, the current flowing via the conductive path being limited to a first maximum value ($I_{lim(M1)}$. Further the circuit arrangement comprises a second transistor (M2) provided with a control input adapted to receive a second control signal, and with a conductive path to be controlled in dependence on the second control signal, the current flowing via the conductive path being limited to a second maximum value ($I_{lim(M2)}$. The first maximum value ($I_{lim(M1)}$ is larger than the second maximum value ($I_{lim(M2)}$. The load (R) is connected in series with the conductive paths of the first and second transistors (M1,M2). If a current of the amount of the second maximum value is flowing through the load (R), the first control signal at the control input of the first transistor (M1) can be set in such a manner that a voltage is caused to drop on the conductive path of the first transistor (M1) which is larger than that voltage which drops if a current of the amount of the second maximum value is flowing via the conductive path of the first transistor (M1).

3 Claims, 4 Drawing Sheets

State of the art

CIRCUIT ARRANGEMENT FOR DRIVING A LOAD BY TWO TRANSISTORS

The present invention relates to a circuit arrangement comprising two transistors connected in series with a driven load.

FIELD OF THE INVENTION

Numerous technical uses exist for circuit arrangements designed to drive, through two driver transistors, a load connected in series with these transistors. A typical example of load driven by such an output stage consists in the electric ignition element of the gas generator for the airbag of a motor vehicle. In this example, a defined minimum power for igniting the electric ignition element is converted therein for a short time. The energy supply in this case is largely provided by an energy store comprising e.g. a capacitor. For protection of the driver transistors but also for safeguarding that no excessive current will flow through the load, an output stage is designed to be current-limiting, which is realized by use of transistors with current-limitation.

FIG. 1 illustrates a known circuit arrangement with current-limitation. In such a current-limiting output stage, a general problem consists in that the distribution of the electric loss power among the two transistors M1 and M2 is nonuniform and thus disadvantageous.

In the known circuit arrangement according to FIG. 1, a load R, which can be resistive, capacitive or inductive, is powered by the two transistors M1 and M2 which can be provided as bipolar or field effect transistors. Since the load may be arranged far away from the two transistors M1 and M2, a short-circuit fuse is required for the two transistors M1 and M2 so as to avoid damage during operation or assembly. Otherwise, short-circuits of the supply lines with the potentials U1 and U2 towards a positive or negative supply would cause damage to the transistors M1 and M2 respectively.

Further, limiting the current can be required for the load R. Thus, for instance, it should be prevented that overcurrents are flowing at the beginning or the end of an on-state. Further, an avoidance of such overcurrents may be advisable because the energy store feeding the circuit arrangement will discharge too quickly. This should be prevented e.g. when using the inventive circuit arrangement in motor vehicles to ignite the ignition elements of the gas generators of a plurality of airbags. Notably, to safeguard the triggering of all airbags even after breakdown of the motor vehicle's network, none of the ignition elements must receive a current larger than the ignition current because the energy in the energy store would otherwise not be sufficient for igniting all of the required airbags.

As already briefly indicated above, the current-limitation in the transistors M1 and M2 is performed in the manner known per se by means of shunt resistors or by measuring the voltage drop across the transistors or part of the transistors. In this regard, it is physically impossible to achieve the same voltage drop and thus the same power across both of the transistors. This is because the transistors, due to manufacturing tolerances, have different limiting currents. As a result, the limitation will always have a stronger effect on one of the two transistors M1 and M2 than on the respective other one. Thus, a very large voltage drop will take place across one of the two transistors M1,M2 so that the largest part of the power has to be consumed by this transistor. In the circuit arrangement according to FIG. 1, it is assumed that the current-limitation across transistor M2 is slightly smaller than across transistor M1; in other words, $I_{lim(M1)}$ is larger than $I_{lim(M2)}$.

If it is further assumed that the on-state resistances of the transistors M1 and M2 in the fully driven state are smaller than the resistance of the load R and that the current obtained by the series connection is larger than the current-limitation on one of the two transistors M1,M2, a very large voltage drop U2 across transistor M2 and thus a very large power consumption by the transistors M2 will occur during operation. The transistor T1 will remain in the fully driven state, and due to the small voltage drop across this transistor, only little power will be consumed. The rest of the power is consumed by the load R. The large power consumption in the transistor T2 may lead to considerable heat-up and eventually cause damage to this transistor. Generally, at least a strong oversizing of the power consumption capability of the transistor M2 will be required. This in turn has an adverse effect on the area requirement of the transistor, considering that the instant circuit arrangement on the whole is provided as an IC circuit.

Another approach to prevent a non-uniform distribution of the loss powers in the two transistors M1 and M2 or to reduce the effect thereof resides in that the two transistors M1,M2 are coupled to each other such that, upon detection of the current-limitation on the transistor M2, the transistor M1 can be influenced by a suitable technique from the field of circuit engineering, e.g. by briefly reducing the current-limitation of the transistor Ml. Such an approach would cause the two transistors M1,M2 to alternately run into the current-limiting range, which in turn would result in undesirable current oscillation phenomena. Besides, it is in numerous applications undesired and, due to large distances, partially hardly even possible to additionally couple the transistors M1,M2 with each other for controlling the current-limitation of one transistor in dependence on the response of the current-limitation of the other transistor.

Known from DE-A-15 13 168 is an output stage for driving a load wherein two serially connected transistors are in turn connected in series with the load which is to be driven. One of the two transistors is controlled to have the current on its conductive path limited to a maximum value.

It is an object of the invention to provide a circuit arrangement, designed for driving a load by two transistors connected in series, which makes it possible to distribute the loss power onto both transistors in a simple manner.

SUMMARY OF THE INVENTION

In the circuit arrangement according to the invention, the two transistors have their control inputs respectively connected to current-limiting circuits which have the effect that the currents flowing via the conductive paths of the transistors are limited to first and second maximum values, respectively. The current-limiting value of the first transistor is larger than the current-limiting value of the second transistor. This, as already mentioned above in the description of the circuit arrangement known from the state of the art, is actually the normal case, as caused by manufacturing tolerances of the transistors. This normal case is deliberately utilized by the invention in that, with the second transistor subjected to voltage limitation, the voltage drop across the first transistor is increased so that a part of the power which otherwise would have been consumed by the second transistor is transmitted to the first transistor. Notably, according to the invention, if a current of the amount of the second maximum value is flowing, the control signal at the control input of the first transistor can be set in such a manner that a voltage is caused to drop on the conductive path of the first transistor which is larger than that voltage which would drop if a current of the amount of the second maximum value were flowing via the conductive path of the first transistor.

The influencing of the control signal at the control input of the first transistor can be realized simply through feedback of the voltage drop across the first transistor. Thus, the inventive circuit arrangement obviates the need for a coupling and an additional connecting of the current-limiting circuits of both transistors, so that, with lowest expenditure, the loss power to be handled in the two transistors is distributed in a more evenly, thus preventing that one of the two transistors hap to take up a substantially higher loss power than the other one.

According to an advantageous embodiment, a comparator is provided to compare the voltage drop via the conductive path of the first transistor with a reference voltage. If the voltage drop on the conductive path of the first transistor is larger than the reference voltage, this comparator will emit an output signal influencing the first control signal for the control input of the first transistor. A still more simple feedback of the voltage drop at the first transistor towards the control input thereof is realized in that the current-limiting switch of the first transistor is controlled in dependence on a first voltage source supplying a first reference voltage and that the first transistor is connected as a voltage follower. Thus, at least for a defined length of time or a defined operating condition, the voltage drop across the first transistor cannot become larger than the reference voltage; consequently, the voltage drop across the transistor will be substantially equal to the reference voltage.

An embodiment of the invention will be explained in greater detail hereunder with reference to the accompanying drawings.

DETAILED DESCRIPTION OF PREFERRED EMBODIMENTS

Figure 1:
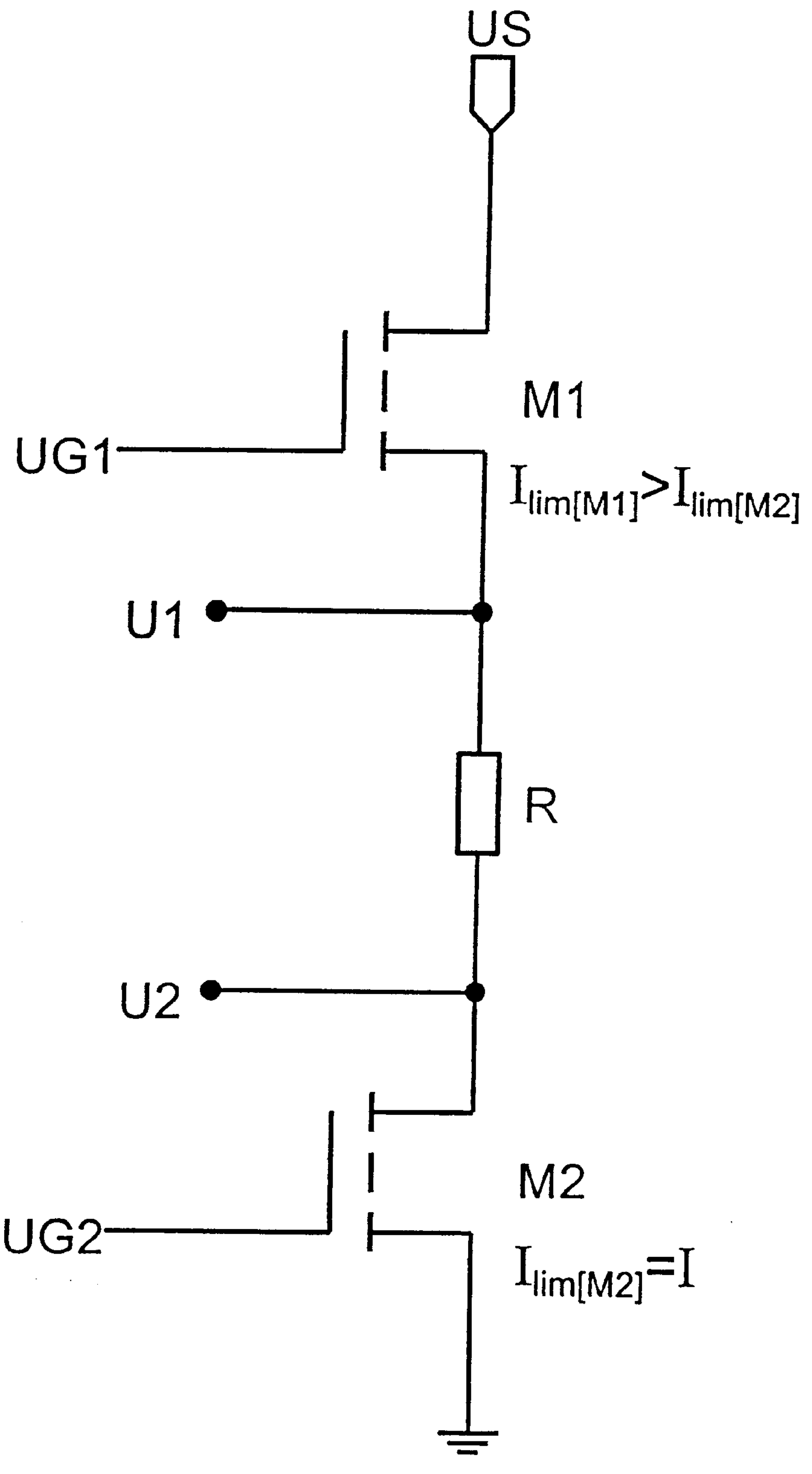
FIG. 1 is a view of the circuit arrangement according to the state of the art.
Figure 2:
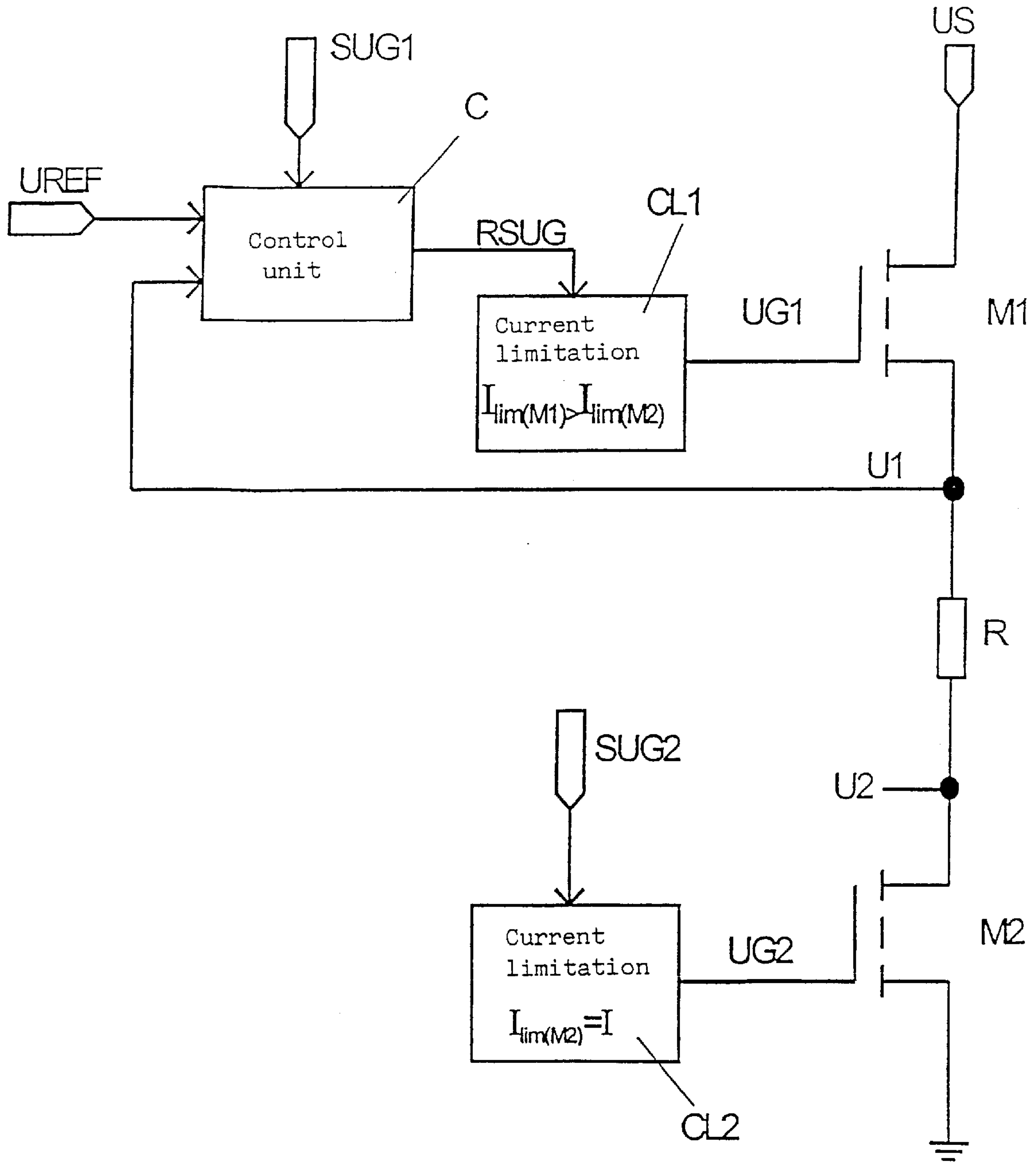
FIGS. 2 to 4 are views of different embodiments of a circuit arrangement according to the invention for driving a load by two transistors connected in series with the load.

The circuit arrangement shown in FIG. 2 is illustrative of a first aspect of the invention for obtaining an improved distribution of power onto the two transistors M1 and M2 during flow of a current through the load R. The current limitations impressed upon the transistors and control elements, respectively, have deliberately chosen to be different. In this arrangement, the supply voltage SUG2 of the current-limiting circuit CL2 for the transistor M2 serves for generating a control voltage UG2 for transistor M2. In the current-limiting circuit CL2 for transistor M2, this voltage is controlled to have a maximum current $I_{lim(M2)}$ across transistor M2. A similar feature is normally provided also for transistor M1. According to the invention, however, the current limitation for transistor M1 is set in a well-aimed manner to be larger than the current limitation for transistor M2. Thus, $$I_{lim(M1)} > I_{lim(M2)}.$$

This means that in case of an overload, the voltage drop U2 will always be first increased across M2 because $I_{lim(M2)}$ determines the limitation. Transistor M1 would normally be loaded to a relatively small extent. By means of a feedback, the voltage drop (difference between US and U1) across transistor M1 is compared to a reference voltage UREF in the control unit C. The control voltage UG1 for transistor M1 is set by the current-limiting circuit CL1 of transistor M1 in such a manner that the voltage across U1, in addition to being subjected to the voltage limitation $I_{lim(M1)}$, is made equal to the voltage across UREF. Thus, at least for a defined period of time or a defined operating condition, U1 will be equal to UREF. Therefore, the voltage drop across transistor M1 is artificially increased, and part of the load that would otherwise be received by transistor M2 is "pulled" to transistor M1.

The reference voltage UREF can be freely selected, and thus also the power distribution onto the two transistors M1 and M2 is freely selectable. The reference voltage UREF can be generated from the supply voltage US by a voltage divider or have a fixed voltage applied thereto, so that, when this voltage is exceeded, the voltage drop and thus the power consumption across U1 will be minimized or only then become fully effective. Also combinations of fixed and proportionate voltage portions across UREF or changes over time are possible.

Figure 3:
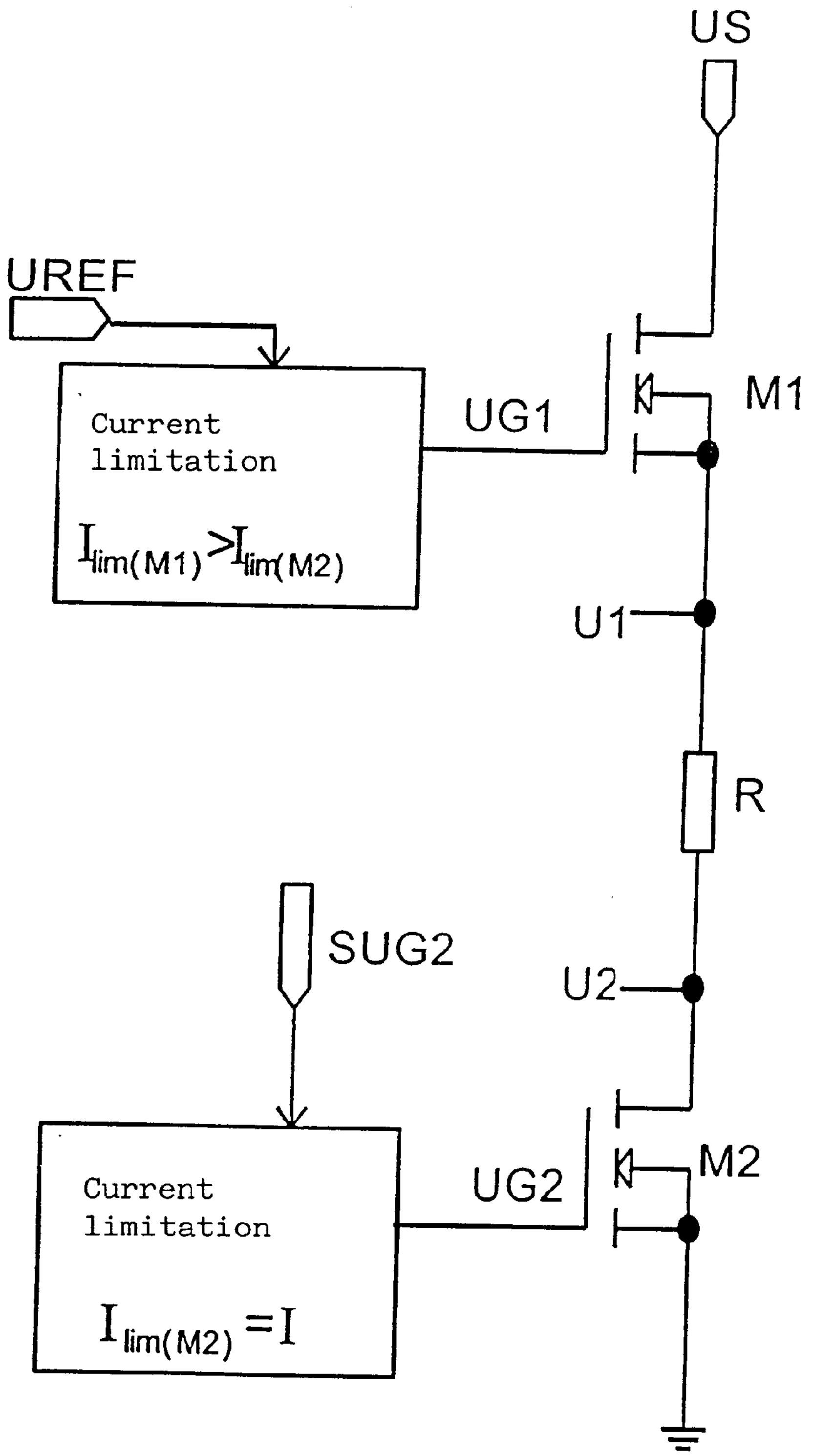

A further embodiment of the inventive circuit arrangement is shown in FIG. 3. This circuit arrangement, as compared to the circuit arrangement of FIG. 2, is simplified in that a feedback of the voltage to U1 is omitted and that the control voltage RSUG1 of the circuit of FIG. 2, required for controlling the current-limiting circuit CL1 for transistor M1, is generated directly from the reference voltage UREF. This is accomplished by designing the transistor T1 as a voltage follower. Also in the example according to FIG. 3, the voltage across U1 will at least for a defined period of time or a defined operating condition be equal to the reference voltage UREF.

Using the circuit arrangement of the invention, a wide power distribution range can be set with regard to the locations, working conditions (voltages) and time periods without the need for coupling the current-limiting circuits of the two transistors M1 and M2. This means that the two transistors M1,M2 can be arranged far away from each other. Thus, two transistors M1,M2 can be easily optimized with regard to their load-carrying capacities.

In the context of the embodiments described hereinabove, it has always been assumed that the voltage drop across transistor M1 is artificially increased. By way of alternative, however, it can be provided to artificially increase the voltage drop across transistor M2; in other words, the circuit arrangements shown in FIGS. 2 and 3 can be realized in reversed configuration. In such cases, the reference voltage UREF would act on U2, and $I_{lim(M2)}$ would be larger than $I_{lim(M1)}$.

Figure 4:
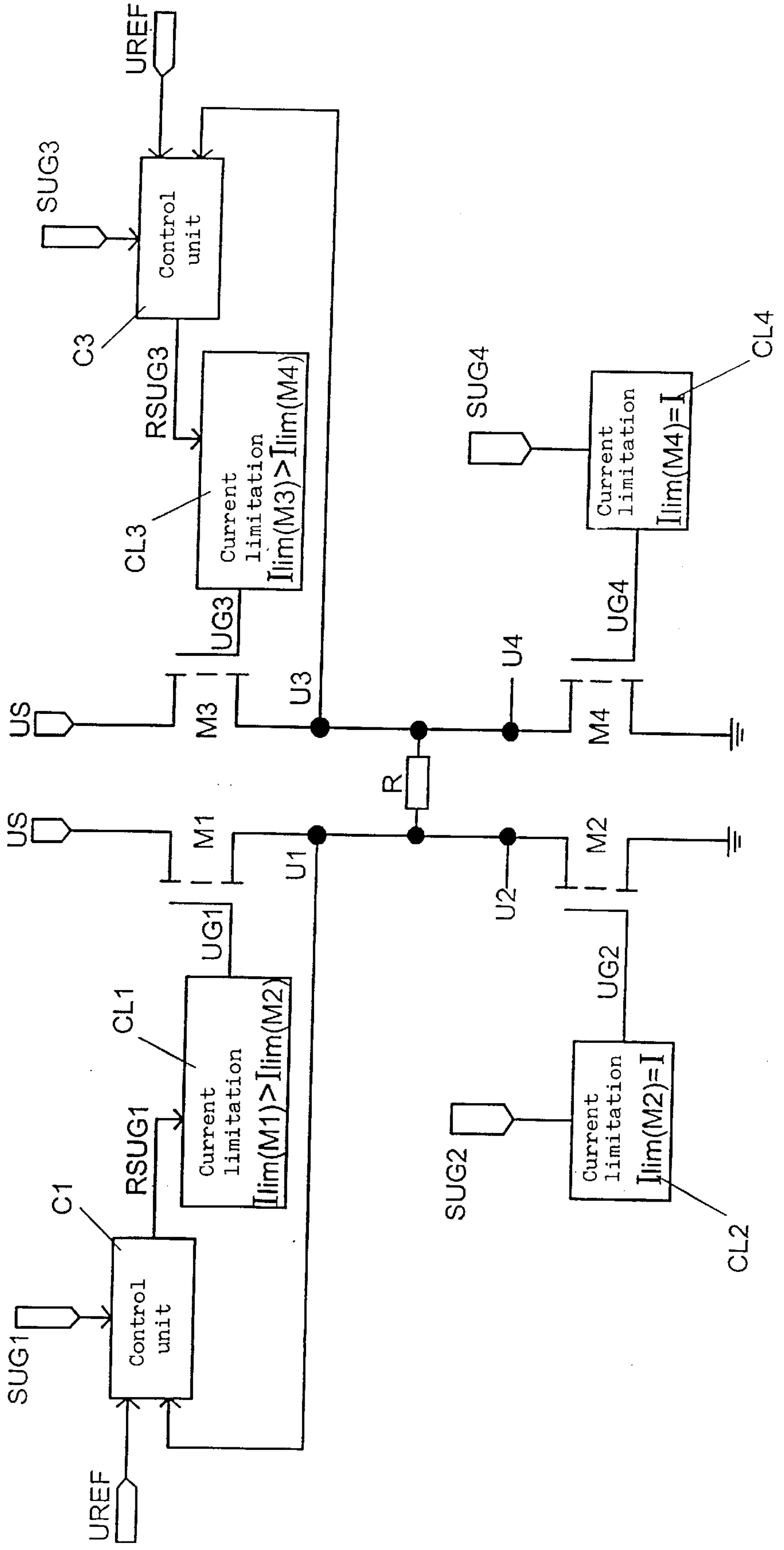

The circuit arrangements illustrated in FIGS. 2 and 3 can also be complemented to form a (full) bridge circuit. In FIG. 4, such a full bridge circuit is shown for the circuit variant according to FIG. 2. Depending on the direction of the current through load R, the current will flow through the pair of transistors M1,M4 or M2,M3.

Although various embodiments of the invention have been described above, it is understood that these are merely illustrative and are not to be interpreted as delimiting the invention to the specific embodiments shown. Instead, numerous variants and modifications will be evident to the expert in the field. The scope of the invention is delimited solely by the following claims.

What is claimed is:

1. A circuit arrangement for driving a load by two transistors connected in series with the load, comprising:

a first transistor (M1) comprising a control input adapted to receive a first control signal, and a conductive path to be controlled in dependence on the first control signal, the current flowing via the conductive path being limited to a first maximum value ($I_{lim(M1)}$, a second transistor (M2) comprising a control input adapted to receive a second control signal, and a conductive path to be controlled in dependence on the second control signal, the current flowing via the conductive path being limited to a second maximum value ($I_{lim(M2)}$, wherein the first maximum value ($I_{lim(M1)}$ is larger than the second maximum value ($I_{lim(M2)}$, the load (R) is connected in series with the conductive paths of the first and second transistors (M1,M2), and if the load (R) has a current of the amount of the second maximum value flowing therethrough, the first control signal at the control input of the first transistor (M1) can be set in such a manner that a voltage is caused to drop on the conductive path of the first transistor (M1) which is larger than that voltage which drops if a current of the amount of the second maximum value is flowing via the conductive path of the first transistor (M1).

2. The circuit arrangement according to claim 1, characterized in that a comparator (C1) is provided to compare the voltage drop on the conductive path of the first transistor (M1) with a reference voltage and that, if the voltage drop is larger than the reference voltage, the comparator (C1) will emit an output signal for influencing the first control signal for the control input of the first transistor (M1).

3. The circuit arrangement according to claim 1, characterized in that the first control signal on the control input of the first transistor (M1) can be set in dependence on an external voltage source supplying a reference voltage, and that the first transistor (M1) is arranged as a voltage follower.

* * * * *